US007489203B2

(12) United States Patent
Casorso

(10) Patent No.: US 7,489,203 B2
(45) Date of Patent: Feb. 10, 2009

(54) NOISE TOLERANT PHASE LOCKED LOOP

(75) Inventor: Anthony J. Casorso, Westminster, CO (US)

(73) Assignee: Quantum Corporation, San Jose, CA (US)

( * ) Notice: Subject to any disclaimer, the term of this patent is extended or adjusted under 35 U.S.C. 154(b) by 100 days.

(21) Appl. No.: 11/510,211

(22) Filed: Aug. 24, 2006

(65) Prior Publication Data
US 2008/0069283 A1 Mar. 20, 2008

(51) Int. Cl.
H03L 7/085 (2006.01)
(52) U.S. Cl. .............................. 331/25; 327/5; 360/51; 375/376
(58) Field of Classification Search .................. 331/16, 331/25; 360/46, 51; 375/376; 327/2, 3, 327/5
See application file for complete search history.

(56) References Cited

U.S. PATENT DOCUMENTS 5,757,855 A * 5/1998 Strolle et al. ................ 375/262
6,236,343 B1 5/2001 Patapoutian
6,396,788 B1 * 5/2002 Feyh et al. ................ 369/59.22
2007/0071152 A1 * 3/2007 Chen et al. .................. 375/355

OTHER PUBLICATIONS

Nayak, Aravind R. et al. (Aug. 14, 2002) "Lower Bounds for the Performance of Iterative Timing Recovery at Low SNR," Proceedings of the 15th International Symposium on Mathematical Theory of Networks and Systems, University of Notre Dame, South Bend, Indiana, Aug. 12-16, 10 pages.
Nayak, Aravind (Jun. 2004) *Iterative Timing Recovery for Magnetic Recording Channels with Low Signal-to-Noise Ratio*, Ph.D. Thesis, School of Electrical and Computer Engineering, Georgia Institute of Technology, 179 pages.

* cited by examiner

*Primary Examiner*—Robert Pascal
*Assistant Examiner*—Levi Gannon
(74) *Attorney, Agent, or Firm*—Morrison & Foerster LLP

(57) ABSTRACT

An apparatus and method for providing timing recovery under conditions of low signal to noise ratios (SNRs) is disclosed herein. A preliminary phase error signal is generated by comparing an input signal with a preliminary estimation of an output signal corresponding to the input signal. A correction signal is generated as a function of the output signal, input signal, and preliminary phase error signal. The preliminary phase error signal and the correction signal are combined to generate a final phase error signal.

38 Claims, 3 Drawing Sheets

NOISE TOLERANT PHASE LOCKED LOOP

BACKGROUND OF THE INVENTION

The present invention relates to signal detection and correction in the presence of noise. More particularly, the present invention relates to signal detection and correction in the presence of noise using phase locked loops.

When there is low signal to noise ratio (SNR), achieving accurate detection of signals is difficult due to significant amount of noise present with the signals. Typically under these conditions, error correction coding (ECC) can be used to recover the signals. However, timing recovery is a prerequisite for effective implementation of ECC. Phase locked loops (PLLs) provide timing recovery.

PLLs correct for timing phase error using a feedback loop, which permits timing recovery and synchronization for use of ECC. PLLs that are decision directed derive a reference signal from the detected information in order to perform phase error detection. The longer the wait for the reference signal, the more accurate the reference signal, and hence more accurate the phase error detection. However, too long of a wait for an accurate reference signal creates a large delay in the loop, which leads to performance loss. As a balance between relatively long delays in the feedback loop and accuracy of final output, conventional PLLs use a preliminary or early decision signal to form the reference signal. This preliminary decision signal is not as accurate as the final decision signal but is available sooner to minimize loop latencies. When the SNR is relatively high, the higher error rate typical in the preliminary decision signal (as opposed to the final decision signal) is not detrimental and the PLL provides adequate timing recovery. However, as the SNR decreases, the higher error rate typical in the preliminary decision signal results in the PLL losing phase lock, at which point the PLL is unable to provide phase error detection.

As the SNR decreases, the phase error or jitter increases, degrading PLL performance. As an example, when the noise level is high enough such that an error exists for approximately every 1,000 bits in the detected signal, conventional PLLs lose phase lock.

Thus, it would be beneficial for a PLL to minimize loop latencies. It would be beneficial for a PLL to use an early decision signal having characteristics of a later decision signal. It would be beneficial for a PLL to maintain phase lock at low SNRs. It would be beneficial for a playback device of a data storage unit to permit use of ECC at low SNRs by providing time recovery under a range of SNR conditions.

BRIEF SUMMARY OF THE INVENTION

An aspect of the invention relates to a noise tolerant phase lock loop (PLL) operable under conditions of low signal to noise ratios (SNRs). The noise tolerant PLL includes a phase detector that generates a preliminary phase error signal by comparing an input signal with a preliminary estimation of an output signal corresponding to the input signal. A correction signal is generated as a function of the output signal, input signal, and preliminary phase error signal. The preliminary phase error signal and the correction signal are combined to generate a final phase error signal.

The final phase error signal from the phase detector drives a loop filter and an oscillator. The oscillator provides a feedback signal to the PLL in appropriate response to the final phase error signal. The correction signal is representative of a signal approximately equal in magnitude and opposite in polarity to an error present in the preliminary estimation of the output signal. The output signal is representative of the input signal corrected for errors and is the read data signal.

The noise tolerant PLL may be used in a data readout device such as, but not limited to, a tape drive, a tape cartridge drive, a single reel tape cartridge drive, a magnetic drive, an optical drive, a disk drive, or a playback device. The noise tolerant PLL may be used where decision directed PLLs are implemented.

Other features and aspects of the invention will become apparent from the following detailed description, taken in conjunction with the accompanying drawings which illustrate, by way of example, the features in accordance with embodiments of the invention. The summary is not intended to limit the scope of the invention, which is defined by the claims attached hereto.

BRIEF DESCRIPTION OF THE DRAWINGS

The exemplary embodiments will become more fully understood from the following detailed description, taken in conjunction with the accompanying drawings, wherein the reference numeral denote similar elements, in which.

Figure 1:
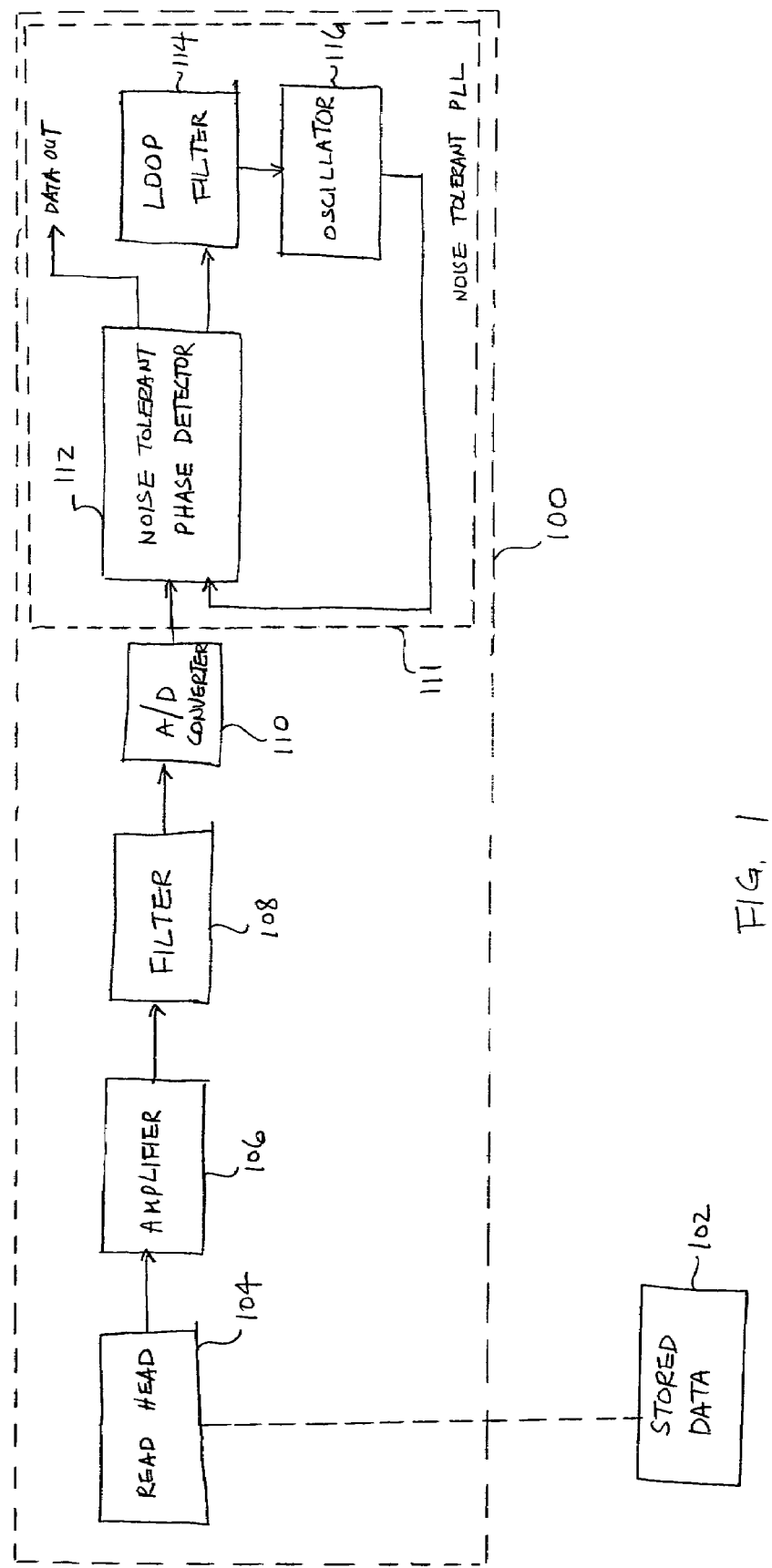
FIG. 1 is a block diagram of an apparatus including one embodiment of a noise tolerant phase lock loop (PLL).

In the drawings, the most significant digit or digits in a reference number refer to the figure number in which that element is first introduced (e.g., element 1104 is first introduced and discussed with respect to FIG. 11).

The headings provided herein are for convenience only and do not necessarily affect the scope or meaning of the claimed invention.

DETAILED DESCRIPTION OF THE PREFERRED EMBODIMENTS

Described in detail below is an apparatus and method for providing robust timing recovery under a range of signal to noise ratios (SNRs) for accurate detection of signals. A phase locked loop (PLL) circuit is configured to minimize loop latencies by use of early estimate signals while maintaining synchronization under conditions of low SNR. A data read device, such as a tape drive, can thus read out data encoded on a tape cartridge even when the SNR is low.

The following description provides specific details for a thorough understanding of, and enabling description for, embodiments of the invention. However, one skilled in the art will understand that the invention may be practiced without these details. In other instances, well-known structures and functions have not been shown or described in detail to avoid unnecessarily obscuring the description of the embodiments of the invention.

Referring to FIG. 1, a block diagram of a data readout device 100 including an embodiment of a PLL using an early decision signal operable at low SNR is shown. The data readout device 100 detects or reads data stored at a data storage device 102. The data readout device 100 comprises a variety of devices such as, but not limited to, a tape drive, a tape cartridge drive, a single reel tape cartridge drive, an optical drive, a magnetic drive, a disk drive, or a playback device. The data storage device 102 comprises a variety of portable or non-portable data storage media such as, but not limited to, a magnetic tape cartridge, a single reel tape cartridge, optical media, or disk media. The data readout device 100 includes a read head 104, an amplifier 106, a filter 108, an analog-to-digital (A/D) converter 110, and a noise tolerant PLL 111. The amplifier 106, filter 108, A/D converter 110, and/or PLL 111 can be implemented in circuitry and/or included in a semiconductor chip.

The read head 104 is in sufficient proximity to the data storage device 102, and in particular, to a section of the data storage device 102 containing the desired data, to read data signals from the data storage device 102. The read head 104 includes one or more detectors and controllers to obtain the data stored in the data storage device 102. Although not shown, the data storage device 102 may be located within the data readout device 100 for purposes of reading and/or writing data to the data storage device 102. The data readout device 100 can include one or more read out channels and correspondingly, one or more read heads.

The amplifier 106 receives read data signals from the read head 104 and outputs corresponding amplified read data signals. The amplified data signals are then filtered in the filter 108. The filtered signals are inputs to the A/D converter 110. The outputs of the A/D converter 110 are digital data signals. The digital data signals are inputs to the PLL 111, and in particular to the phase detector 112.

The amplifier 106 can comprise one or more amplifiers. For example, the amplifier 106 may comprise a pre-amplifier and a control amplifier. The filter 108 can comprise one or more filters. The filter 108 may be a low-pass filter. Although the filter 108 is shown coupled between the amplifier 106 and the A/D converter 110, it is contemplated that the order of the amplifier 106, filter 108, and A/D converter 110 relative to each other can be different than shown in FIG. 1. It is also contemplated that additional signal processing components or circuitry may be included in the data readout device 100 to provide read data signals suitable for the PLL 111.

The digital data signals, also referred to as input signals or input samples 118, represent data encoded in the data storage device 102 as voltage values between 0 to 255 (or other range of values), which are sampled at a certain sample rate and converted into digital format. The amplifier 106, filter 108, and/or A/D converter 110 provide some processing of the read data signals. However, for the most part, the input samples 118 are still "raw" data signals requiring further processing. For example, error present in the stored data signals, noise associated with the read head 104, read out error associated with the read head 104, error introduce from the amplifier 106, filter 108, and/or A/D converter 110, power supply noise, etc. is present in the input samples 118.

A noise tolerant phase detector 112, a loop filter 114, and an oscillator 116 comprise the PLL 111. In one embodiment, the PLL 111 comprises a digital PLL (DPLL). The PLL 111 may be implemented in systems where decision directed PLLs are used. The PLL 111 may be implemented using analog, digital, and/or logic components and/or circuitry. The PLL 111 may be implemented using hardware, software, firmware, and/or other available functional components. The PLL 111 may include additional components or circuitry from those discussed with respect to FIG. 2.

In the PLL 111, the phase detector 112 receives the input samples 118 and provides two outputs, phase error signals 120 and final read data signals 122. The phase error signals 120 are inputs to the loop filter 114. The output of the loop filter 114 is the input to the oscillator 116. The output of the oscillator 116 is the second input to the phase detector 112. In one embodiment, the A/D converter 110 may be included in the PLL 111.

The loop filter 114 includes a loop filter frequency accumulator register to "remember" the phase error signals 120. The loop filter 114 averages the phase error and provides a smooth control signal for the oscillator 116. The loop filter 114 can be a proportional plus integral filter. The oscillator 116 is a clock for a read out channel of the data readout device 100. The oscillator 116 can be a numerically controlled oscillator (NCO). The final read data signals 122 represent the data read out of the data storage device 102 corrected for errors (e.g., at least noise compensated). The final read data signals 122, also referred to as final data signals or data out signals, may be further processed (e.g., by application of error correction codes (ECCs)) to become the final output of a read channel of the data storage device 102.

Figure 2:
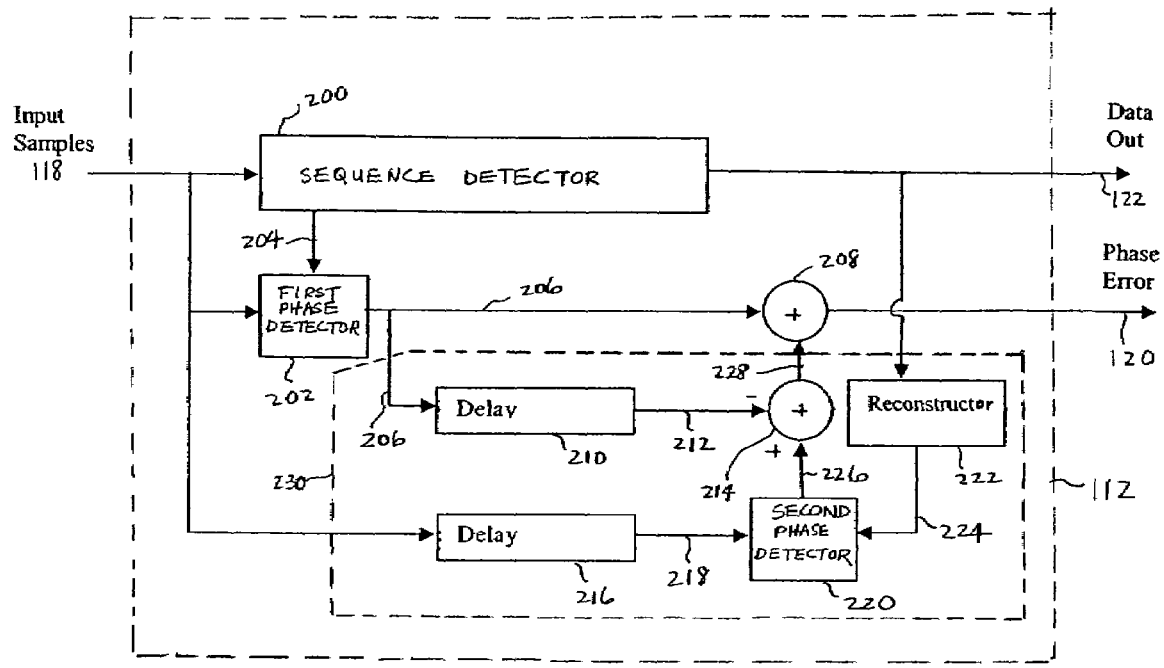
FIG. 2 is a detailed block diagram of a noise tolerant phase detector included in the PLL of FIG. 1.

Referring to FIG. 2, one embodiment of a detailed block diagram of the phase detector 112 is shown. The phase detector 112 is operable to provide phase detection and correction functions. The phase detector 112 applies a correction signal derived from a final data out signal to the detected phase difference between an early reference signal and the input signal to determine the final phase error. Use of the early reference signal minimizes loop latencies. Use of the correction signal aids in continued phase lock at low SNRs.

The input samples 118 are received by each of a sequence detector 200, a first phase detector 202, and a delay component 216. In response, the sequence detector 200 outputs the final read data signals 122 and an early reference signal 204. The early reference signal 204, also referred to as an early decision signal or preliminary read data out signal, is generated before the final read data signals 122. The final read data signals 122 are generated a fixed number of clock cycles after the input samples 118 are received in the sequence detector 200. The early reference signal 204 is also generated a fixed number of clock cycles (less than that for the final read data signals 122) after receipt of the input samples 118. The number of clock cycles is a matter of design choice, desired response time of the PLL 111, desired error correction accuracy, and/or inherent to the sequence detector 200. As an example, the sequence detector 200 may be a Viterbi detector that takes twenty clock cycles to generate the final read data signals 122 and approximately four clock cycles to generate the early reference signal 204.

The early reference signal 204 is an input to the first phase detector 202. The input samples 118 are the other input to the first phase detector 202. The first phase detector 202 compares the input samples 118 to the early reference signal 204. The detected phase difference between the two signals is outputted as a first result signal 206. The first result signal 206 is representative of an early or preliminary phase error detected in the input signal 118. The first result signal 206 is an input to each of an adder 208 and a delay component 210. The first phase detector 202 may be a Muller-Mueller detector.

Each of the delay components 210, 216 is operable to provide an output that is the same as its input, except delayed by a fixed amount of time relative to receipt of the input. Each of the delay components 210, 216 is configured to provide a time delay $D_2$. The time delay $D_2$ is less than a time delay $D_1$ associated with the sequence detector 200. The time delay $D_2$ is determined relative to the time delay $D_1$. Each of the delay components 210, 216 may be a delay register. Continuing the example, if the sequence detector 200 generates the final read data signals 122 in twenty clock cycles and the early reference signal 204 in four clock cycles, then the time delay $D_2$ can be approximately sixteen clock cycles (factoring in any signal propagation delays) such that generation of outputs of the delay components 210, 216 will coincide with generation of a final reference signal 224.

The input to the delay component 210 is the first result signal 206 from the first phase detector 202. The output of the delay component 210 is a delayed first result signal 212. The input to the delay component 216 is the input samples 118. The output of the delay component 216 is a delayed input signal 218.

The final read data signals 122 from the sequence detector 200 are provided to a reconstructor 222. The reconstructor 222, also referred to as a reconstruction unit or convolutor, is operable to output a convolution of the final read data signals 122 with a partial response target. The read channel (and most tape and disk read channels) uses a partial response, maximum likelihood (PRML) technique, in which there is a partial response target. The partial response target is a sequence of coefficients. The partial response target sequence is convolved with the transitions in the output data sequence of the sequence detector 200 to reconstruct an "improved" input sample sequence. The output of the reconstructor 222, also referred to as the final reference signal 224, is a corrected or "improved" version of the input samples 118.

The delayed input signal 218 from the delay component 216 and the final reference signal 224 from the reconstructor 222 are the inputs to a second phase detector 220. The second phase detector 220 compares the two inputs to detect a phase difference. The detected phase difference is outputted as a second result signal 226. The first and second phase detectors 202, 220 can be same type of detectors. The second phase detector 220 may be a Muller-Mueller detector.

A subtractor 214 subtracts the delayed first result signal 212 from the second result signal 226 to generate a correction signal 228. The correction signal 228 is representative of a signal approximately equal in magnitude and opposite in polarity to an error present in the early reference signal 204. The correction signal 228 is the output of the bottom portion of the phase detector 112, referred to as a correction loop, circuit, or subcomponent 230.

The correction signal 228 and the first result signal 206 are added in the adder 208 to generate the phase error signals 120. Hence, the outputs of the phase detector 112 are the read final data signals 122 and the phase error signals 120.

The phase error signals 120 provide timing recovery for the associated read channel. The phase error signals 120 cause the oscillator 116 to adjust clock trigger signals that drive circuitry and components associated with the read channel. When the SNR is high, the early reference signal 204 and the final read data signal 122 will be the same. The outputs of the first and second phase detectors 202, 220 will also be the same and the correction signal 228 will be zero. As the SNR decreases, the early reference signal 204 and final read data signal 122 will differ, the early reference signal 204 containing more errors. This causes the correction signal 228 to be a non-zero value. At low SNR values (e.g., on the order of 10 dB), the early reference signal 204 may contain an order of a hundred times more errors than the final read data signals 122. With conventional PLLs, this error from the early reference signal would pass to the loop filter and oscillator, which after a long enough sequence of errors in the same positive or negative polarity, will eventually lead to loss of synchronization. With the phase detector 112, the correction signal 228 provides a correction of an amount opposite in polarity to the error from the early reference signal 204 to the loop filter 114 and oscillator 116 after the sequence detector 200 delay. Thus, the phase detector 112 prevents long term accumulation of error in the loop filter 114 and oscillator 116, and prevents lose of synchronization at low SNRs.

Although not shown in FIG. 2, another reconstructor, similar to the reconstructor 222, is provided between the sequence detector 200 and the first phase detector 202. The early reference signal 204 is the output of this reconstructor. A preliminary signal from the sequence detector 200 is convolved with a partial response target. The early reference signal 204 represents a signal that is an "improved" version of the preliminary signal from the sequence detector 200. It is also contemplated that if the reconstructor outputting the early reference signal 204 and/or the reconstructor 222 can be implemented within the sequence detector 200, then such integration may be desirable.

In another embodiment, the sequence detector 200 (or functionalities of the sequence detector 200) may be provided external to the phase detector 112 or the PLL 111. In still another embodiment, a separate circuit, referred to as a slicer, may be implemented to develop the early reference signal 204 and the final read data signal 122.

Figure 3:
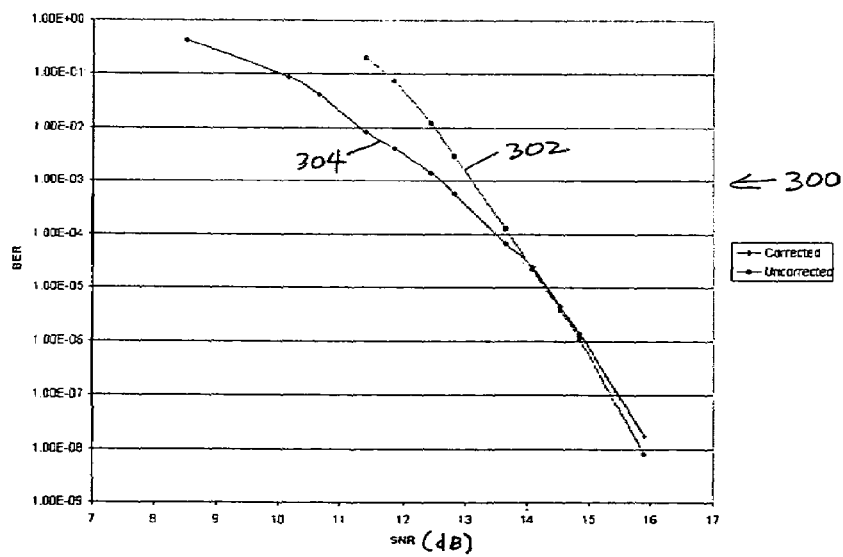
FIG. 3 is a graph illustrating the operational output of a data read channel utilizing a conventional PLL vs. the same data read channel utilizing the noise tolerant PLL of FIG. 1.

In FIG. 3, a graph 300 shows the bit error rate (BER) as a function of SNR. BER as a function of SNR for a conventional PLL is shown by plotline 302. BER as a function of SNR with the timing recovery provided by the PLL 111 is shown by plotline 304. When the SNR is approximately 14 dB or lower, the resulting BER using the PLL 111 is lower than the BER without the PLL 111. The divergence in the BER values between the plotlines 302 and 304 increases as the SNR decreases. With conventional PLLs, lose of phase lock occurs around 11 db. With the PLL 111, phase lock can be maintained till at least about 8.5 db. The PLL 111 provides dynamic or adaptive error correction over a wider range of SNRs, especially at lower SNRs. When little or no errors exist (e.g., at high SNRs), then the presence of the phase detector 112 does not adversely degrade the read data signals.

Figure 4:
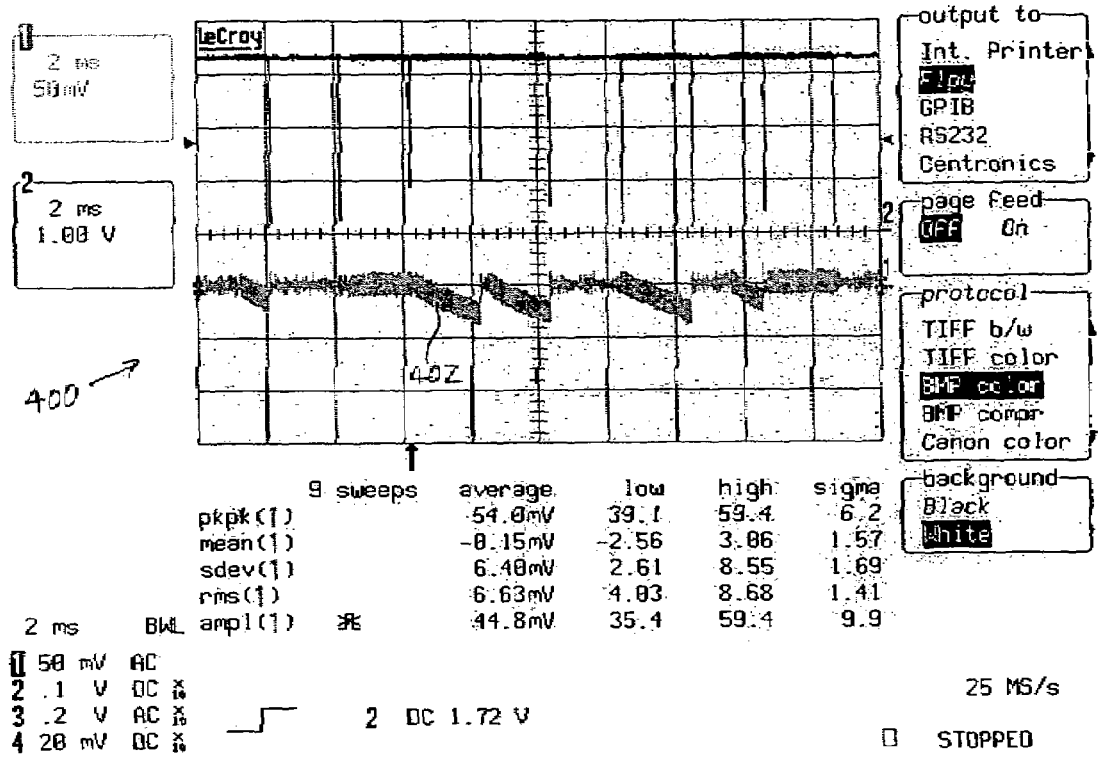
FIG. 4 is a screenshot illustrating the inability of a conventional PLL to maintain phase lock.
Figure 5:
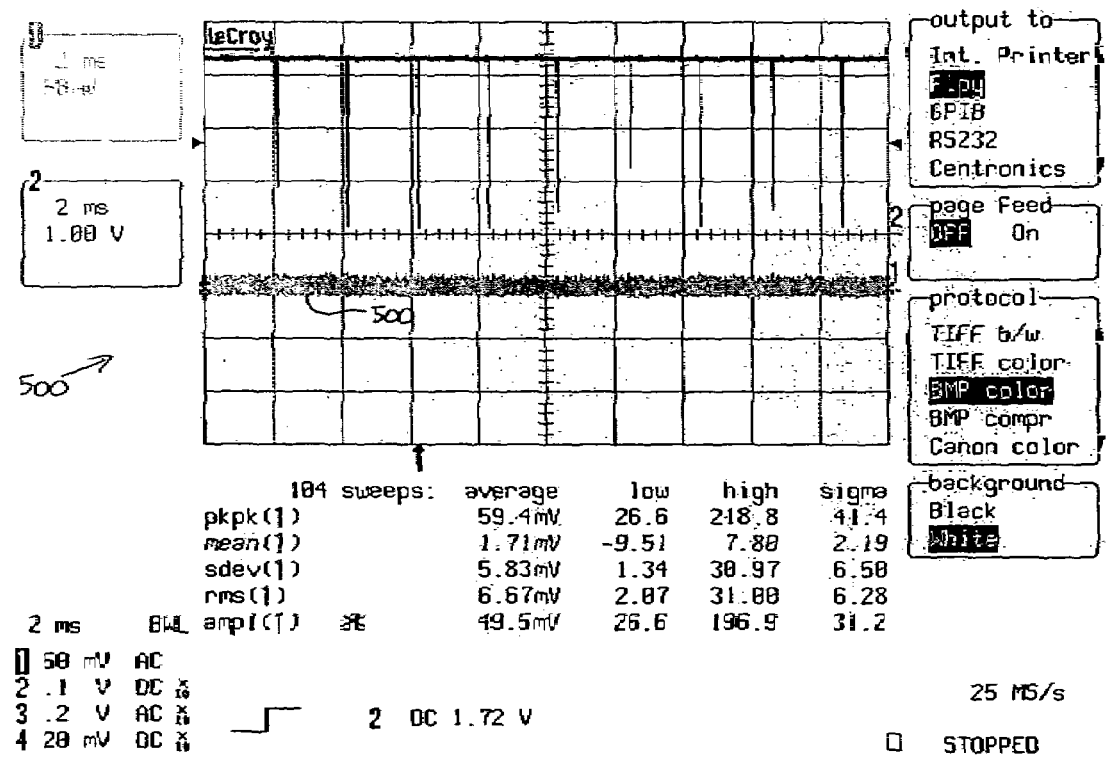
FIG. 5 is a screenshot illustrating the maintained phase lock of the noise tolerant PLL of FIG. 1.

FIGS. 4-5 are oscilloscope screenshots illustrating the output of the frequency register of a loop filter coupled to a PLL under identical conditions, except screenshot 400 shows the output using a conventional PLL and screenshot 500 shows the output using the PLL 111. In FIG. 4, a trace 402 often slopes downward, illustrating the conventional PLL losing phase lock at 11.4 db SNR. In FIG. 5, a trace 502 is horizontal, illustrating that the PLL 111 maintains phase lock at 11.4 db SNR.

In this manner, a noise tolerant PLL is operable to detect a phase difference between an input signal and an early reference signal of a sequence detector, and to apply a correction signal to the detected phase difference between the input signal and the early reference signal to output a final phase error signal for timing recovery. The correction signal is generated from a correction circuit or subcomponent of the noise tolerant phase detector. The correction signal is derived by additionally using each of the input signal and the detected phase difference between the input signal and the early reference signal, the usage delayed until a final data output of the sequence detector is generated. When the final data output of the sequence detector is available, the final data output is processed into a final reference signal. The final reference signal and the delayed input signal drive a second phase detector. The delayed phase difference between the input signal and the early reference signal is subtracted from the output of the second phase detector to generate the correction signal. Accordingly, the noise tolerant PLL has the ability to maintain synchronization over a wider range of SNRs, e.g., at SNRs of approximately 14 dB or lower.

It will be appreciated that the above description for clarity has described embodiments of the invention with reference to different functional units. However, it will be apparent that any suitable distribution of functionality between different functional units may be used without detracting from the invention. Hence, references to specific functional units are only to be seen as references to suitable means for providing the described functionality rather than indicative of a strict logical or physical structure or organization.

The invention can be implemented in any suitable form including hardware, software, firmware, circuitry, integrated circuitry, semiconductor devices, or any combination thereof. Different aspects of the invention may be implemented at least partly as computer software or firmware running on one or more data processors and/or digital signal processors. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units and processors.

Although the present invention has been described in connection with some embodiments, it is not intended to be limited to the specific form set forth herein. Rather, the scope of the present invention is limited only by the claims. Additionally, although a feature may appear to be described in connection with a particular embodiment, one skilled in the art would recognize that various features of the described embodiments may be combined in accordance with the invention. Moreover, aspects of the invention describe in connection with an embodiment may stand alone as an invention.

Moreover, it will be appreciated that various modifications and alterations may be made by those skilled in the art without departing from the spirit and scope of the invention. The invention is not to be limited by the foregoing illustrative details, but is to be defined according to the claims.

What is claimed is:

1. A method for providing timing recovery during data reads, the method comprising:
    determining an initial phase error signal of an input signal, wherein the input signal comprises data read from a data storage device;
    generating a correction signal as a function of the input signal, an output signal of a sequence detector, and the initial phase error signal; and
    generating a final phase error signal from the initial phase error signal and the correction signal, wherein the final phase error signal is representative of a phase error in the input signal.

2. The method of claim 1, wherein generating a correction signal comprises:
    delaying the input signal till the output signal has been generated;
    determining a second phase difference signal between the delayed input signal and the output signal;
    delaying the initial phase error signal till the output signal has been generated; and
    subtracting the initial phase error signal from the determined second phase difference signal to output the correction signal.

3. The method of claim 2, wherein determining a second phase difference signal comprises:
    determining a final reference signal from convolution of the output signal with a partial response target; and
    applying the final reference signal and the delayed input signal to determine the second phase difference signal.

4. The method of claim 1, wherein the correction signal is representative of a signal approximately equal in magnitude and opposite in polarity to an error present in the difference between the initial phase error signal and the input signal.

5. The method of claim 1, wherein the sequence detector comprises a Viterbi detector.

6. The method of claim 1, further comprising:
    reading data stored in the data storage device;
    amplifying the read data;
    filtering the amplified data; and
    converting the filtered data into digital format, wherein the converted data comprises the input signal.

7. The method of claim 1, wherein the initial phase error signal is generated prior to the output signal.

8. A noise tolerant phase detector, comprising:
    a sequence detector operable to receive an input signal and to output an early reference signal and a data out signal, wherein the early reference signal is generated before the data out signal;
    a first phase detector coupled to the sequence detector, the first phase detector operable to receive the early reference signal from the sequence detector and to compare the input signal with the early reference signal to output a first result signal; and
    a correction component operable to receive the input signal, the first result signal, and the data out signal to generate a correction signal, wherein the correction signal is representative of a signal approximately equal in magnitude and opposite in polarity to an error present in the early reference signal, and wherein a final phase error signal is generated from the first result signal and the correction signal.

9. The phase detector of claim 8, wherein the correction component comprises:
    a reconstructor operable to receive the data out signal from the sequence detector and to output a final reference signal, wherein the final reference signal is representative of the input signal corrected of errors;
    a second phase detector operable to compare the input signal delayed by a fixed amount of time after the input signal is received by the sequence detector with the final reference signal to output a second result signal; and
    an adder operable to compare the first result signal delayed by the fixed amount of time with the second result signal to output the correction signal.

10. The phase detector of claim 9, wherein the correction component comprises a first delay component coupled between the second phase detector and an input line for the input signal, wherein the first delay component provides the input signal delayed by the fixed amount of time to the second phase detector.

11. The phase detector of claim 9, wherein the correction component comprises a second delay component coupled between the first phase detector and the adder, wherein the second delay component provides the first result signal delayed by the fixed amount of time to the adder.

12. The phase detector of claim 9, wherein the reconstructor is operable to perform a convolution of the data out signal with a partial response target.

13. The phase detector of claim 9, wherein a second reconstructor is coupled between the sequence detector and the first phase detector, the early reference signal the output of the second reconstructor, wherein the second reconstructor is operable to receive a preliminary signal from the sequence detector and to convolve the preliminary signal with a partial response target to output the early reference signal.

14. The phase detector of claim 8, further comprising a subtractor coupled to each of the first phase detector and the correction component to receive the first result signal and the correction signal, respectively, to generate the final phase error signal.

15. The phase detector of claim 8, wherein the sequence detector comprises a Viterbi detector.

16. The phase detector of claim 8, wherein the first phase detector comprises a Muller-Mueller detector.

17. The phase detector of claim 8, wherein the phase detector maintains synchronization at low signal to noise ratios (SNRs).

18. The phase detector of claim 8, wherein the phase detector maintains phase lock at signal to noise ratios (SNRs) at or below approximately 14 dB.

19. The phase detector of claim 8, wherein a phase lock loop (PLL) including the phase detector is decision directed.

20. A data readout apparatus, comprising:
a detector operable to obtain data stored in a data storage device; and
a decision directed phase lock loop (PLL) coupled to the detector, the PLL operable to receive data obtained from the detector and to output a phase error signal and a data out signal, the PLL comprising a sequence detector operable to receive the data obtained from the detector and to output a preliminary version of the data out signal and the data out signal, wherein the preliminary version of the data out signal is generated before the data out signal, the PLL uses the preliminary version of the data out signal and the data out signal to generate the phase error signal, and the PLL maintains synchronization at signal to noise ratios (SNRs) at or below approximately 14 dB.

21. The apparatus of claim 20, further comprising:
an amplifier coupled to the detector to amplify the data obtained from the detector;
a filter coupled to the amplifier to filter the amplified data; and
an analog-to-digital (A/D) converter to digitize the filtered data, wherein the digitized data is the input to the PLL.

22. The apparatus of claim 20, wherein the sequence detector comprises a Viterbi detector.

23. The apparatus of claim 20, wherein the data storage device comprises a single reel tape cartridge.

24. The apparatus of claim 20, wherein the apparatus comprises a single reel tape drive.

25. The apparatus of claim 20, wherein the PLL comprises:
a first phase detector coupled to the sequence detector, the first phase detector operable to receive the preliminary version of the data out signal from the sequence detector and to compare the input signal with the preliminary version of the data out signal to output a first result signal.

26. The apparatus of claim 25, further comprising a subtractor coupled to each of the first phase detector and a correction component to receive the first result signal and a correction signal from the correction component, respectively, to generate the phase error signal.

27. The apparatus of claim 20, wherein the PLL comprises:
a correction component operable to receive the input signal, a first result signal from a first phase detector, and the data out signal to generate a correction signal, wherein the correction signal is representative of a signal approximately equal in magnitude and opposite in polarity to an error present in the preliminary version of the data out signal, and wherein the phase error signal is generated from the first result signal and the correction signal.

28. The apparatus of claim 27, wherein the correction component comprises:
a reconstructor operable to receive the data out signal from the sequence detector and to output a final reference signal, wherein the final reference signal is representative of the input signal corrected of errors;
a second phase detector operable to compare the input signal delayed by a fixed amount of time after the input signal is received by the sequence detector with the final reference signal to output a second result signal; and
an adder operable to compare the first result signal delayed by the fixed amount of time with the second result signal to output the correction signal.

29. The apparatus of claim 28, wherein the correction component comprises a first delay component coupled between the second phase detector and an input line for the input signal, wherein the first delay component provides the input signal delayed by the fixed amount of time to the second phase detector.

30. The apparatus of claim 28, wherein the correction component comprises a second delay component coupled between the first phase detector and the adder, wherein the second delay component provides the first result signal delayed by the fixed amount of time to the adder.

31. The apparatus of claim 28, wherein the reconstructor is operable to perform a convolution of the data out signal with a partial response target.

32. Circuitry for providing timing recovery under conditions of low signal to noise ratios (SNRs), comprising:
a convolution unit to convolve a read data signal from a data storage device with a partial response target;
a first delay register to delay an input signal by a fixed amount of time;
a phase detector to compare the delayed input signal with the convolved read data signal and to output a result signal;
a second delay register to delay an early result signal generated from comparison of the input signal with an early estimation of the read data signal;
a subtractor operable to subtract the delayed early result signal from the result signal and to output a correction signal; and
an adder operable to add the early result signal with the correction signal to generate a final phase error signal for timing recovery.

33. The circuitry of claim 32, wherein the read data signal from the data storage device is processed by a slicer circuit prior to providing to the convolution unit.

34. The circuitry of claim 32, wherein the read data signal from the data storage device is processed by a sequence detector prior to proving to the convolution unit.

35. The circuitry of claim 32, wherein the delayed early result signal is generated from a second phase detector.

36. The circuitry of claim 35, wherein at least one of the phase detector and the second phase detector comprises a Muller-Mueller detector.

37. The circuitry of claim 32, wherein the correction signal is representative of a signal approximately equal in magnitude and opposite in polarity to an error present in the early estimation of the read data signal.

38. The circuitry of claim 32, wherein the circuitry is operable at SNRs at or below approximately 14 dB.

* * * * *